US011201172B2

(12) United States Patent
Seo et al.

(10) Patent No.: US 11,201,172 B2
(45) Date of Patent: *Dec. 14, 2021

(54) SEMICONDUCTOR DEVICE

(71) Applicant: Samsung Electronics Co., Ltd., Suwon-si (KR)

(72) Inventors: Jae-Woo Seo, Seoul (KR); Ki-Man Park, Hwaseong-si (KR); Ha-Young Kim, Seoul (KR); Junghwan Shin, Seoul (KR); Keunho Lee, Hwaseong-si (KR); Sungwe Cho, Hwaseong-si (KR)

(73) Assignee: SAMSUNG ELECTRONICS CO., LTD., Suwon-si ( * ) Notice: Subject to any disclaimer, the term of this patent is extended or adjusted under 35 U.S.C. 154(b) by 0 days.

This patent is subject to a terminal disclaimer.

(21) Appl. No.: 17/153,939

(22) Filed: Jan. 21, 2021

(65) Prior Publication Data

US 2021/0143181 A1 May 13, 2021

Related U.S. Application Data

(63) Continuation of application No. 16/669,639, filed on Oct. 31, 2019, now Pat. No. 10,930,675.

(30) Foreign Application Priority Data

Nov. 20, 2018 (KR) .................. 10-2018-0143562
Apr. 2, 2019 (KR) .................. 10-2019-0038256

(51) Int. Cl.
*H03K 3/356* (2006.01)
*H01L 27/118* (2006.01)
(Continued)

(52) U.S. Cl.
CPC .... *H01L 27/11807* (2013.01); *H01L 27/0207* (2013.01); *H03K 3/35625* (2013.01);
(Continued)

(58) Field of Classification Search
CPC .......... H01L 27/11807; H01L 27/0207; H01L 2027/11875; H01L 2027/11866; H03K 3/35625
(Continued)

(56) References Cited

U.S. PATENT DOCUMENTS 5,847,421 A * 12/1998 Yamaguchi ......... H01L 27/0207
257/207
8,188,549 B2  5/2012 Ishii
(Continued)

FOREIGN PATENT DOCUMENTS

JP          2012-227395 A      11/2012

*Primary Examiner* — Ryan Jager
(74) *Attorney, Agent, or Firm* — Muir Patent Law, PLLC

(57) ABSTRACT

Disclosed is a semiconductor device including a substrate with first and second regions adjacent to each other in a first direction, and first to third gate electrodes extending from the first region toward the second region. Each of the first and second regions includes a PMOSFET region and an NMOSFET region. The first to third gate electrodes extend in the first direction and are sequentially arranged in a second direction different from the first direction. The first and third gate electrodes are supplied with a first signal. The second gate electrode is supplied with a second signal that is an inverted signal of the first signal. The first gate electrode includes a first gate of the first region and a first gate of the second region. The first gates are aligned and connected with each other in the first direction.

28 Claims, 16 Drawing Sheets

(51) Int. Cl.
   *H01L 27/02* (2006.01)
   *H03K 3/3562* (2006.01)
(52) U.S. Cl.
   CPC .............. *H01L 2027/11866* (2013.01); *H01L 2027/11875* (2013.01)
(58) Field of Classification Search
   USPC ......................................................... 327/203
   See application file for complete search history.

(56) References Cited

U.S. PATENT DOCUMENTS

| | | |
|---|---|---|
| 9,627,408 B1 | 4/2017 | Haigh |
| 9,640,480 B2 | 5/2017 | Gupta et al. |
| 9,641,161 B1 * | 5/2017 | Liu .................... H03K 3/35625 |
| 10,270,432 B2 * | 4/2019 | Liu .................... H03K 3/35625 |
| 10,511,293 B2 * | 12/2019 | Seo .................... H01L 27/0207 |
| 10,530,345 B2 * | 1/2020 | Liu .................... H03K 3/35625 |
| 2009/0167394 A1 * | 7/2009 | Bosshart ............ H03K 3/35625 327/203 |
| 2013/0268904 A1 * | 10/2013 | Baeg ....................... G06F 30/39 716/104 |
| 2017/0194349 A1 | 7/2017 | Chen et al. |
| 2017/0244394 A1 | 8/2017 | Kim et al. |
| 2017/0277819 A1 | 9/2017 | Kim et al. |
| 2017/0317100 A1 | 11/2017 | Kang et al. |
| 2017/0317666 A1 * | 11/2017 | Liu ................. G01R 31/318541 |
| 2017/0365594 A1 | 12/2017 | Yang |
| 2018/0183414 A1 * | 6/2018 | Guo .................... H01L 27/0924 |
| 2019/0207593 A1 * | 7/2019 | Seo .................. G01R 31/31727 |
| 2019/0229715 A1 * | 7/2019 | Liu ................. G01R 31/318541 |

* cited by examiner

SEMICONDUCTOR DEVICE

CROSS-REFERENCE TO RELATED APPLICATION

This U.S. nonprovisional application is a continuation of U.S. application Ser. No. 16/669,639 filed on Oct. 31, 2019, which claims priority under 35 U.S.C § 119 to Korean Patent Application Nos. 10-2018-0143562 filed on Nov. 20, 2018 and 10-2019-0038256 filed on Apr. 2, 2019 in the Korean Intellectual Property Office, the entire contents of which are hereby incorporated by reference.

BACKGROUND

The present inventive concepts relate to a semiconductor device, and more particularly, to a semiconductor device including a field effect transistor.

Semiconductor devices are widely used in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices have been gradually complicated and integrated to meet these requested characteristics.

SUMMARY

The present disclosure provides a semiconductor device including highly-integrated field effect transistors.

According to an exemplary embodiments of the present inventive concept, a semiconductor device includes a substrate including a first region and a second region that is adjacent in a first direction to the first region, and a first gate electrode, a second gate electrode, and a third gate electrode that extend from the first region toward the second region. Each of the first and second regions includes a P-type metal-oxide field-effect transistor (PMOSFET) region and an N-type metal-oxide field-effect transistor (NMOSFET) region. Each of the first, second, and third gate electrodes extends in the first direction such that each of the first, second, and third gate electrodes extends lengthwise in the first direction. Each of the PMOSFET region and the NMOSFET region may extend lengthwise in a second direction different from the first direction. The second gate electrode is interposed between the second gate electrode and the third gate electrode in a second direction different from the first direction. The first and third gate electrodes are configured to receive a first signal. The second gate electrode is configured to receive a second signal that is an inverted signal of the first signal. The first gate electrode includes a first gate of the first region and a first gate of the second region. The first gate of the first region and the first gate of the second region are aligned and connected with each other in the first direction.

According to an exemplary embodiment of the present inventive concept, a semiconductor device includes a flip-flop cell on a substrate, the flip-flop cell including a first region including a master latch and a second region including a slave latch, the second region being adjacent in a first direction to the first region, and a first gate electrode, a second gate electrode, and a third gate electrode that extend from the first region toward the second region and are sequentially arranged in a second direction different from the first direction. Each of the first, second, and third gate electrodes extends in the first direction. The first and third gate electrodes are supplied with a clock signal. The second gate electrode is supplied with a clock bar signal that is an inverted signal of the clock signal. The second gate electrode includes a second gate that is a gate of a PMOS transistor of the first region, a gate of an NMOS transistor of the first region, a gate of an NMOS transistor of the second region, and a gate of a PMOS transistor of the second region.

According to an exemplary embodiment of the present inventive concept, a semiconductor device includes a first flip-flop cell and a second flip-flop cell that are adjacent to each other in a first direction on a substrate, and a first gate electrode, a second gate electrode, and a third gate electrode that extend from the first flip-flop cell toward the second flip-flop cell and are sequentially arranged in a second direction different from the first direction. Each of the first, second, and third gate electrodes extends in the first direction. The first and third gate electrodes are supplied with a scan enable signal. The second gate electrode is supplied with a scan enable bar signal. The second gate electrode includes a second gate that is a gate of a PMOS transistor of the first flip-flop cell, a gate of an NMOS transistor of the first flip-flop cell, a gate of an NMOS transistor of the second flip-flop cell, and a gate of a PMOS transistor of the second flip-flop cell.

DETAILED DESCRIPTION OF EMBODIMENTS

Figure 1:
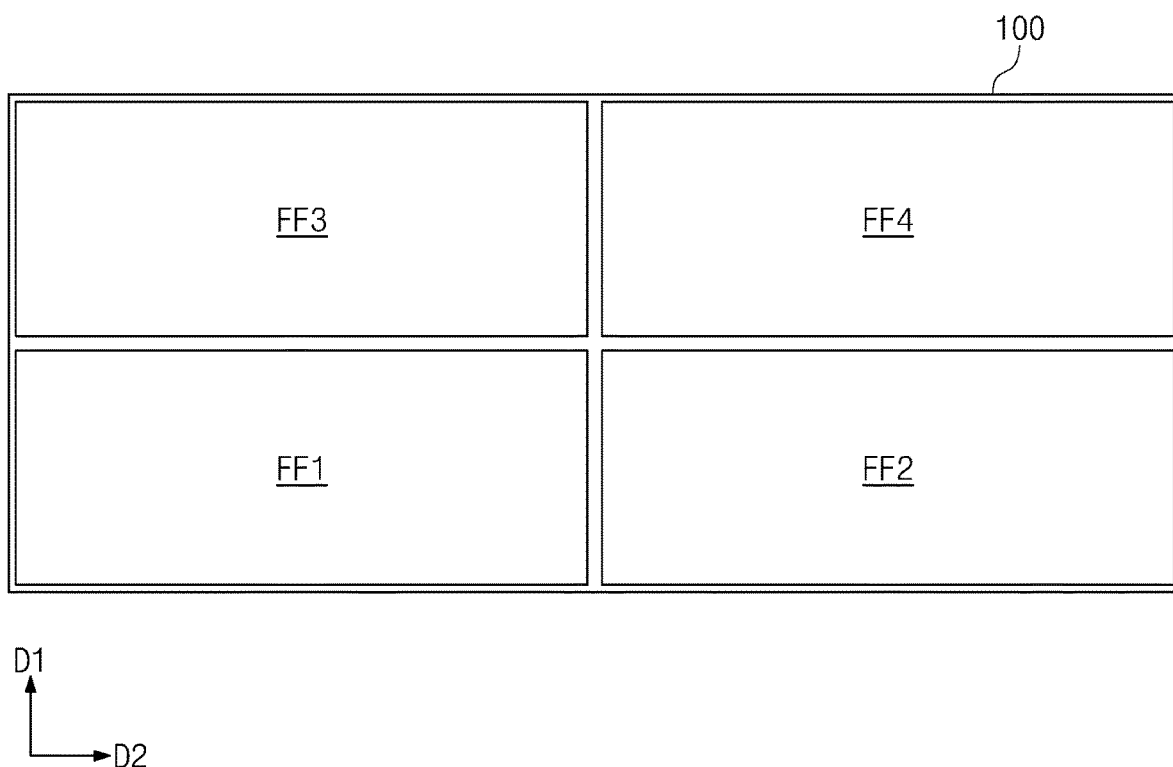
FIG. 1 illustrates a plan view showing a logic region of a semiconductor device according to some example embodiments of the present inventive concepts.

FIG. 1 illustrates a plan view showing a logic region of a semiconductor device according to some example embodiments of the present inventive concepts.

Referring to FIG. 1, a plurality of flip-flop cells FF1 to FF4 may be provided on a logic region of a substrate 100. The flip-flop cells FF1 to FF4 may be two-dimensionally arranged on the logic region of the substrate 100. The flip-flop cells FF1 to FF4 may include a first flip-flop cell FF1, a second flip-flop cell FF2, a third flip-flop cell FF3, and a fourth flip-flop cell FF4. The second flip-flop cell FF2 may be adjacent in a second direction D2 to the first flip-flop cell FF1. The third flip-flop cell FF3 may be adjacent in a first direction D1 to the first flip-flop cell FF1. The fourth flip-flop cell FF4 may be adjacent in the second direction D2 to the third flip-flop cell FF3. The first direction D1 may be different from the second direction D2.

Figure 2:
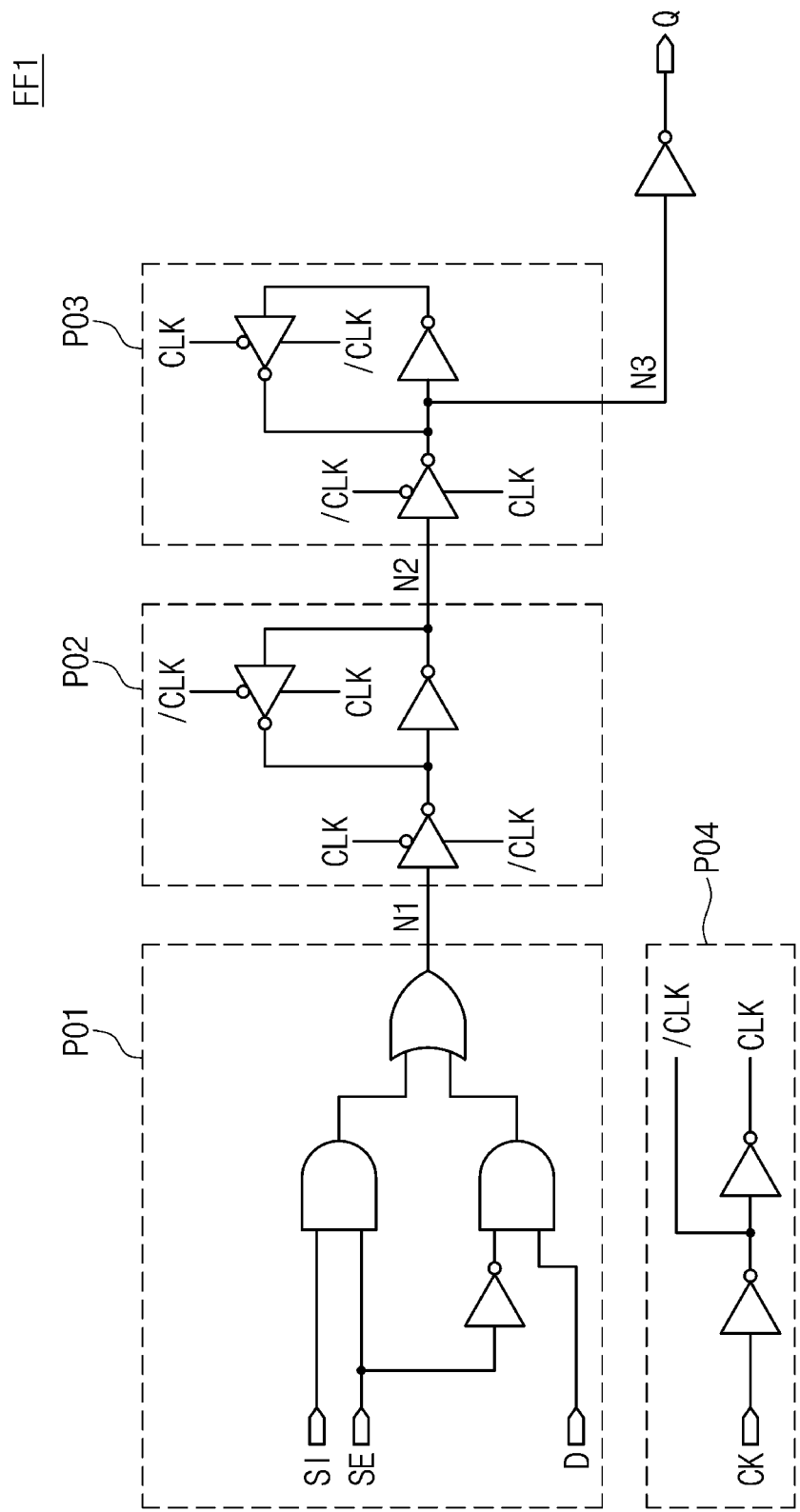
FIG. 2 illustrates a logic circuit diagram showing a flip-flop of a semiconductor device according to some example embodiments of the present inventive concepts.
Figure 3:
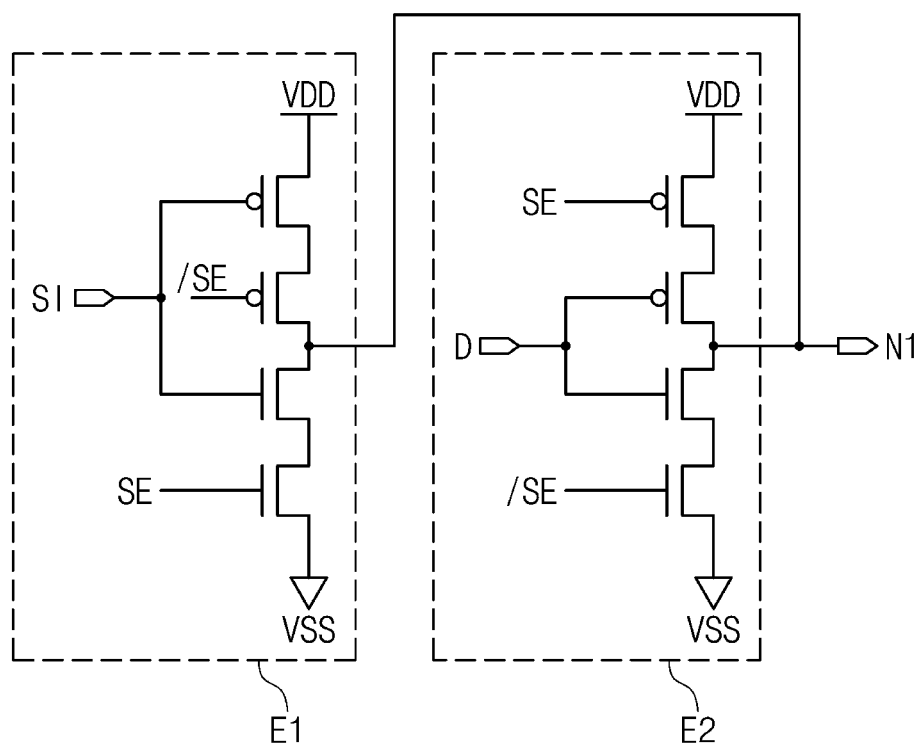
FIG. 3 illustrates an equivalent circuit diagram of a first part shown in FIG. 2.
Figure 4:
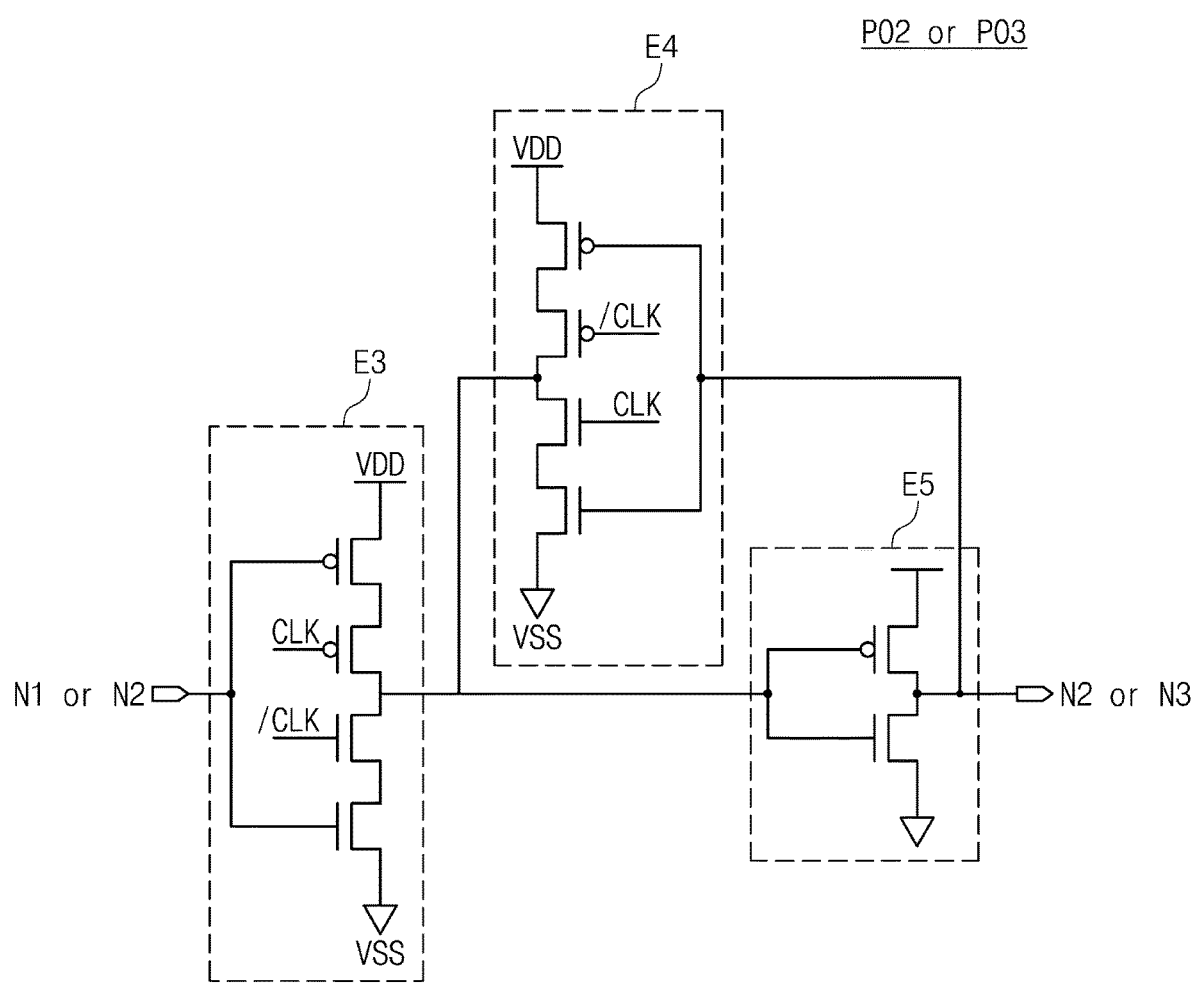
FIG. 4 illustrates an equivalent circuit diagram either of a second part or of a third part shown in FIG. 2.

FIG. 2 illustrates a logic circuit diagram showing a flip-flop of a semiconductor device according to some example embodiments of the present inventive concepts. FIG. 3 illustrates an equivalent circuit diagram of a first part shown in FIG. 2. FIG. 4 illustrates an equivalent circuit diagram either of a second part or of a third part shown in FIG. 2.

Referring to FIGS. 1 to 4, each of the flip-flop cells FF1 to FF4 may include a flip-flop circuit of FIG. 2. The following will representatively describe the first flip-flop cell FF1. The first flip-flop cell FF1 may include first to fourth parts P01 to P04. For example, the first part P01 may be a core circuit that performs a scan function and a flip-flop function. The first part P01 may select one from among an external input signal D and a scan input signal SI, according to a scan enable signal SE, and may provide a first node N1 with the selected signal as an output signal of the first part P01. The first part P01 may be called a multiplexer (or mux), a scan multiplexer (or scan mux), or a selector.

Each of the second and third parts P02 and P03 may be a buffer region. The second part P02 may include a master latch, and the third part P03 may include a slave latch. The master latch of the second part P02 may latch the output signal of the first part P01, based on a clock signal CLK. The slave latch of the third part P03 may latch an output of the master latch and provide an output signal Q, based on a clock signal CLK. The fourth part P04 may include a clock circuit that has connection with a flip-flop and receives an external clock signal CK.

Referring back to FIGS. 2 and 3, the first part P01 may include a first element E1 to which the scan input signal SI is input and a second element E2 to which the external input signal D is input. The first element E1 and the second element E2 may be connected in parallel to the first node N1.

The first element E1 may include first to fourth transistors that are connected in series. The first to fourth transistors may be sequentially disposed between VDD and VSS terminals. Each of the first and second transistors may be a P-type metal-oxide-semiconductor (PMOS) transistor, and each of the third and fourth transistors may be an N-type metal-oxide-semiconductor (NMOS) transistor. The scan input signal SI may be input to the first and third transistors, a scan enable bar signal /SE may be input to the second transistor, and the scan enable signal SE may be input to the fourth transistor.

The second element E2 may include first to fourth transistors that are connected in series. The first to fourth transistors may be sequentially disposed between the VDD and VSS terminals. The first and second transistors may be PMOS transistors, and the third and fourth transistors may be NMOS transistors. The external input signal D may be input to the second and third transistors, the scan enable signal SE may be input to the first transistor, and the scan enable bar signal /SE may be input to the fourth transistor.

Referring back to FIGS. 2 and 4, the second part P02 may include a third element E3, a fourth element E4, and a fifth element E5 that are disposed between the first node N1 and a second node N2. The fourth element E4 and the fifth element E5 may be connected in parallel between the third element E3 and the second node N2. A clock signal CLK and a clock bar signal /CLK may be input to each of the third element E3 and the fourth element E4.

The third part P03 may be configured to include elements substantially the same as the third, fourth, and fifth elements E3, E4, and E5 of the second part P02. The third, fourth, and fifth elements E3, E4, and E5 of the third part P03 may be disposed between the second node N2 and a third node N3.

The second part P02 may include a master latch, and the third part P03 may include a slave latch. Although the following description is directed toward the second part P02, this description may also be identically or similarly applicable to the third part P03.

The third element E3 may include first to fourth transistors that are connected in series. The first to fourth transistors may be sequentially disposed between VDD and VSS terminals. The first and second transistors may be PMOS transistors, and the third and fourth transistors may be NMOS transistors. The first and fourth transistors may receive signals from the first node N1. The clock signal CLK may be input to the second transistor, and the clock bar signal /CLK may be input to the third transistor.

The fourth element E4 may include first to fourth transistors that are connected in series. The first to fourth transistors may be sequentially disposed between VDD and VSS terminals. The first and second transistors may be PMOS transistors, and the third and fourth transistors may be NMOS transistors. The first transistor and the fourth transistor may be connected to the second node N2. The clock bar signal /CLK may be input to the second transistor, and the clock signal CLK may be input to the third transistor.

Table 1 below is a timing table of the flip-flop according to some example embodiments of the present inventive concepts.

TABLE 1

| D[n] | SI | SE | CK | Q[n + 1] |
|------|----|----|----|----------|
| 1 | X | 0 | Low→High | 1 |
| 0 | X | 0 | Low→High | 0 |
| X | X | X | High→Low | Q[n] |
| X | 1 | 1 | Low→High | 1 |
| X | 0 | 1 | Low→High | 0 |

In a case that the external input D[n] is logic high and the scan enable signal SE is inactive, the external output Q[n+1] may go to logic high when an external clock signal CK is transitioned from low to high. In a case that the external input D[n] is logic low and the scan enable signal SE is inactive, the external output Q[n+1] may go to logic low when the external clock signal CK is transitioned from low to high. In case that the external input D[n], the scan enable signal SE, and the scan input signal SI are all absent, the external output Q[n+1] may maintain its previous cycle value Q[n+1] when the external clock signal CK is transitioned from high to low. In a case that the external input D[n] is absent and both the scan enable signal SE and the scan input signal SI are active, the external output Q[n+1] may go to logic high when the external clock signal CK is transitioned from low to high. In a case that the external input D[n] is absent, the scan enable signal SE is active, and the scan input signal SI is inactive, the external output Q[n+1] may go to logic low when the external clock signal CK is transitioned from low to high.

Figure 5:
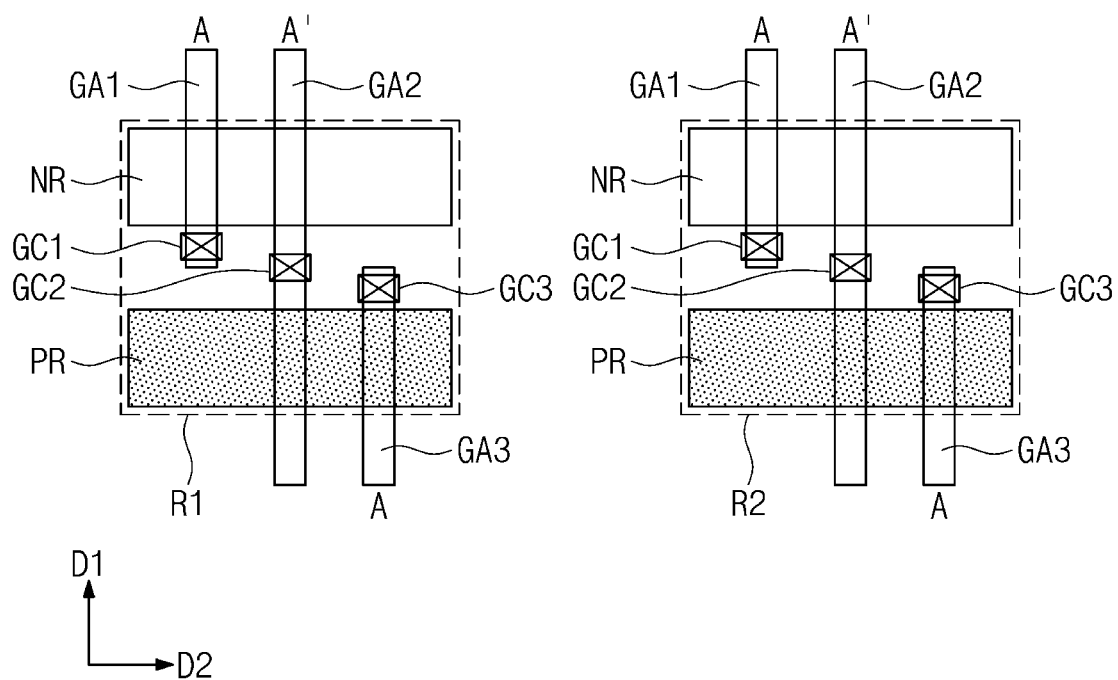
FIG. 5 illustrates a plan view showing first and second regions of a semiconductor device according to some example embodiments of the present inventive concepts.

FIG. 5 illustrates a plan view showing first and second regions of a semiconductor device according to some example embodiments of the present inventive concepts.

Referring to FIGS. 1 and 5, a flip-flop of the present inventive concepts may include a first region R1 and a second region R2 on a substrate. The second region R2 may be spaced apart in a second direction D2 from the first region R1. Each of the first and second regions R1 and R2 may include an N-type metal-oxide field-effect transistor (NMOSFET) region NR and a P-type metal-oxide field-effect transistor (PMOSFET) region PR. The NMOSFET region NR may be an active area of NMOS transistors, and the PMOSFET region PR may be an active area of PMOS transistors.

A plurality of gates GA1, GA2, and GA3 may extend in a first direction D1, while running across the NMOSFET region NR and the PMOSFET region PR. The gates GA1, GA2, and GA3 may include a first gate GA1, a second gate GA2, and a third gate GA3 that are arranged in the second direction D2.

For example, the first gate GA1 may run across the NMOSFET region NR except for the PMOSFET region PR. The second gate GA2 may run across both the NMOSFET region NR and the PMOSFET region PR. The third gate GA3 may run across the PMOSFET region PR except for the NMOSFET region NR. The second gate GA2 may be disposed between the first and third gates GA1 and GA3.

A first signal A may be applied to the first gate GA1. The first signal A may be applied to the third gate GA3. A second signal A' may be applied to the second gate GA2. The second signal A' may be an inversion signal of the first signal A.

First, second, and third gate contacts GC1, GC2, and GC3 may be electrically connected to the first, second, and third gates GA1, GA2, and GA3, respectively. For example, the first region R1 may include three gates GA1, GA2, and GA3 and three gate contacts GC1, GC2, and GC3 respectively connected thereto. The second region R2 may include three gates GA1, GA2, and GA3 and three gate contacts GC1, GC2, and GC3 respectively connected thereto.

In certain embodiments, the first region R1 may be a part of the second part P02 (e.g., the master latch) of the first flip-flop cell FF1 shown in FIGS. 1, 2, and 4. The second region R2 may be a part of the third part P03 (e.g., the slave latch) of the first flip-flop cell FF1 shown in FIGS. 1, 2, and 4. The first signal A applied to the first and third gates GA1 and GA3 may be the clock signal CLK. The second signal A' applied to the second gate GA2 may be the clock bar signal /CLK. The clock bar signal /CLK may be the inverted signal of the clock signal CLK.

For example, the first gate GA1 of the first region R1 may be a gate of the third transistor included in the fourth element E4 of the second part P02 as shown in FIG. 4. The first gate GA1 of the second region R2 may include a gate of the third transistor included in the fourth element E4 of the third part P03 as shown in FIG. 4. The second gate GA2 of the first region R1 may be a gate of the third transistor included in the third element E3 of the second part P02 as shown in FIG. 4 and a gate of the second transistor included in the fourth element E4 of the second part P02 as shown in FIG. 4. The second gate GA2 of the second region R2 may include a gate of the third transistor included in the third element E3 of the third part P03 as shown in FIG. 4 and a gate of the second transistor included in the fourth element E4 of the third part P03 as shown in FIG. 4. The third gate GA3 of the first region R1 may be a gate of the second transistor included in the third element E3 of the second part P02 as shown in FIG. 4. The third gate GA3 of the second region R2 may be a gate of the second transistor included in the third element E3 of the third part P03 as shown in FIG. 4.

In other embodiments, the first region R1 may be either the second part P02 or the third part P03 of the second flip-flop cell FF2 shown in FIGS. 1, 2, and 4. The second region R2 may be either the second part P02 or the third part P03 of the second flip-flop cell FF2 shown in FIGS. 1, 2, and 4.

In yet other embodiments, the first region R1 may be the first part P01 (e.g., the scan multiplexer) of the first flip-flop cell FF1 shown in FIGS. 1, 2, and 4. The second region R2 may be the first part P01 (e.g., the scan multiplexer) of the second flip-flop cell FF2 shown in FIGS. 1, 2, and 4. The first signal A applied to the first and third gates GA1 and GA3 may be the scan enable signal SE. The second signal A' applied to the second gate GA2 may be the scan enable bar signal /SE. The scan enable bar signal /SE may be an inverted signal of the scan enable signal SE.

For example, the first gate GA1 of the first region R1 may be a gate of the fourth transistor included in the first element E1 of the first part P01 of the first flip-flop cell FF1 as shown in FIG. 3. The first gate GA1 of the second region R2 may be a gate of the fourth transistor included in the first element E1 of the first part P01 of the second flip-flop cell FF2 as shown in FIG. 3. The second gate GA2 of the first region R1 may be a gate of the fourth transistor included in the second element E2 of the first part P01 of the first flip-flop cell FF1 as shown in FIG. 3 and a gate of the second transistor included in the first element E1 of the first part P01 of the first flip-flop cell FF1 as shown in FIG. 3. The second gate GA2 of the second region R2 may be a gate of the fourth transistor included in the second element E2 of the first part P01 of the second flip-flop cell FF2 as shown in FIG. 3 and a gate of the second transistor included in the first element E1 of the first part P01 of the second flip-flop cell FF2 as shown in FIG. 3. The third gate GA3 of the first region R1 may be a gate of the first transistor included in the second element E2 of the first part P01 of the first flip-flop cell FF1 as shown in FIG. 3. The third gate GA3 of the second region R2 may be a gate of the first transistor included in the second element E2 of the first part P01 of the second flip-flop cell FF2 as shown in FIG. 3.

The first and third gate contacts GC1 and GC3 of the first region R1 and the first and third gate contacts GC1 and GC3 of the second region R2 may be electrically connected to one or more first upper lines supplying the first signal A. Thus, the first and third gates GA1 and GA3 may be supplied in common with the first signal A supplied from the one or more first upper lines.

The second gate contact GC2 of the first region R1 and the second gate contact GC2 of the second region R2 may be electrically connected to one or more second upper lines supplying the second signal A'. Thus, the second gates GA2 may be supplied in common with the second signal A' supplied from the one or more second upper lines.

Figure 6:
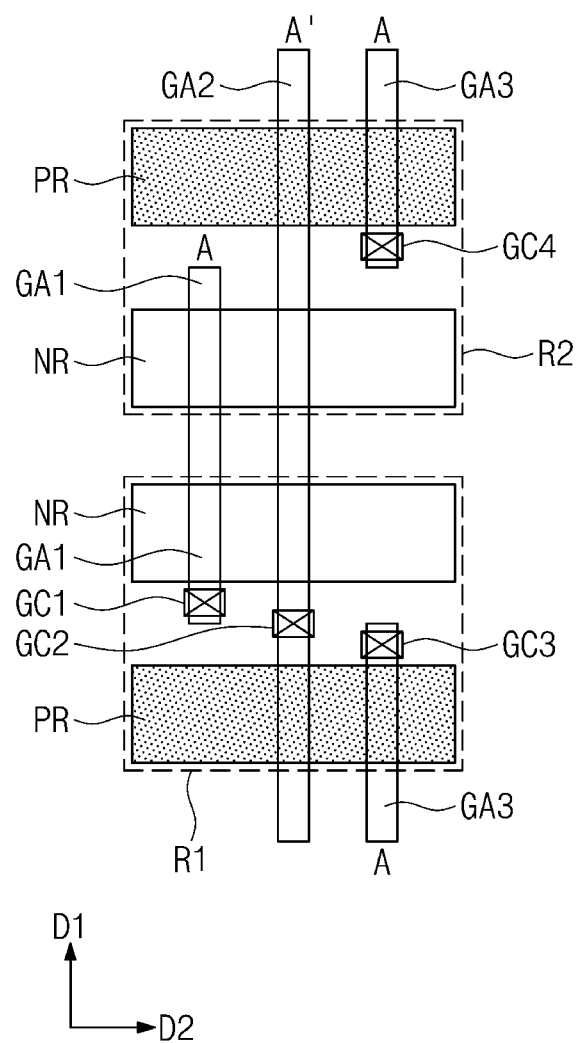
FIG. 6 illustrates a plan view showing first and second regions of a semiconductor device according to some example embodiments of the present inventive concepts.

FIG. 6 illustrates a plan view showing first and second regions of a semiconductor device according to some example embodiments of the present inventive concepts. In the embodiment that follows, a detailed description of technical features repetitive to those discussed above with reference to FIG. 5 will be omitted, and a difference thereof will be discussed in detail.

Referring to FIGS. 1 to 4 and 6, a flip-flop of the present inventive concepts may include a first region R1 and a second region R2 on a substrate. The second region R2 may be adjacent in the first direction D1 to the first region R1. The second region R2 of the present embodiment may be disposed adjacent to the first region R1 in a manner in which the second region R2 of FIG. 5 is upside down.

The first signal A may be applied in common to the first gate GA1 of the first region R1 and the first gate GA1 of the second region R2. The first gate GA1 of the first region R1 and the first gate GA1 of the second region R2 may be connected to constitute a single first gate electrode.

The second signal A' may be applied in common to the second gate GA2 of the first region R1 and the second gate GA2 of the second region R2. The second gate GA2 of the first region R1 and the second gate GA2 of the second region R2 may be connected to constitute a single second gate electrode.

The first and second gate contacts GG1 and GC2 may be electrically connected to the first and second gates GA1 and GA2, respectively. The third gate contact GC3 may be electrically connected to the third gate GA3 of the first region R1. A fourth gate contact GC4 may be electrically connected to the third gate GA3 of the second region R2.

Because the single first gate electrode is constituted by the first gate GA1 of the first region R1 and the first gate GA1 of the second region R2, the first region R1 and the second region R2 may be supplied in common with the first signal A even through a single first gate contact GC1.

Because the single second gate electrode is constituted by the second gate GA2 of the first region R1 and the second gate GA2 of the second region R2, the first region R1 and the second region R2 may be supplied in common with the second signal A' even through a single second gate contact GC2.

The first, third, and fourth gate contacts GC1, GC3, and GC4 may be electrically connected to each other through one or more first upper lines supplying the first signal A. The first and third gates GA1 and GA3 may be supplied in common with the first signal A supplied from the one or more first upper lines. The second gates GA2 may be supplied in common with the second signal A' supplied from one or more second upper lines.

For the embodiment shown in FIG. 5, six gate electrodes and six gate contacts may be required to apply the first signal A and the second signal A' to the first region R1 and the second region R2. For the embodiment shown in FIG. 6, four gate electrodes and four gate contacts may be required to apply the first signal A and the second signal A' to the first region R1 and the second region R2. As such, a placement change of the first and second regions R1 and R2 may reduce the numbers of the gate electrodes and the gate contacts. The number of upper lines for routing may also be decreased due to a reduction in the number of gate contacts that are supposed to have electrical connection with the upper lines. This result may simplify design of connection lines for routing. Furthermore, this result may reduce areas of the connection lines for routing, and accordingly a semiconductor device may increase in integration.

Figure 7:
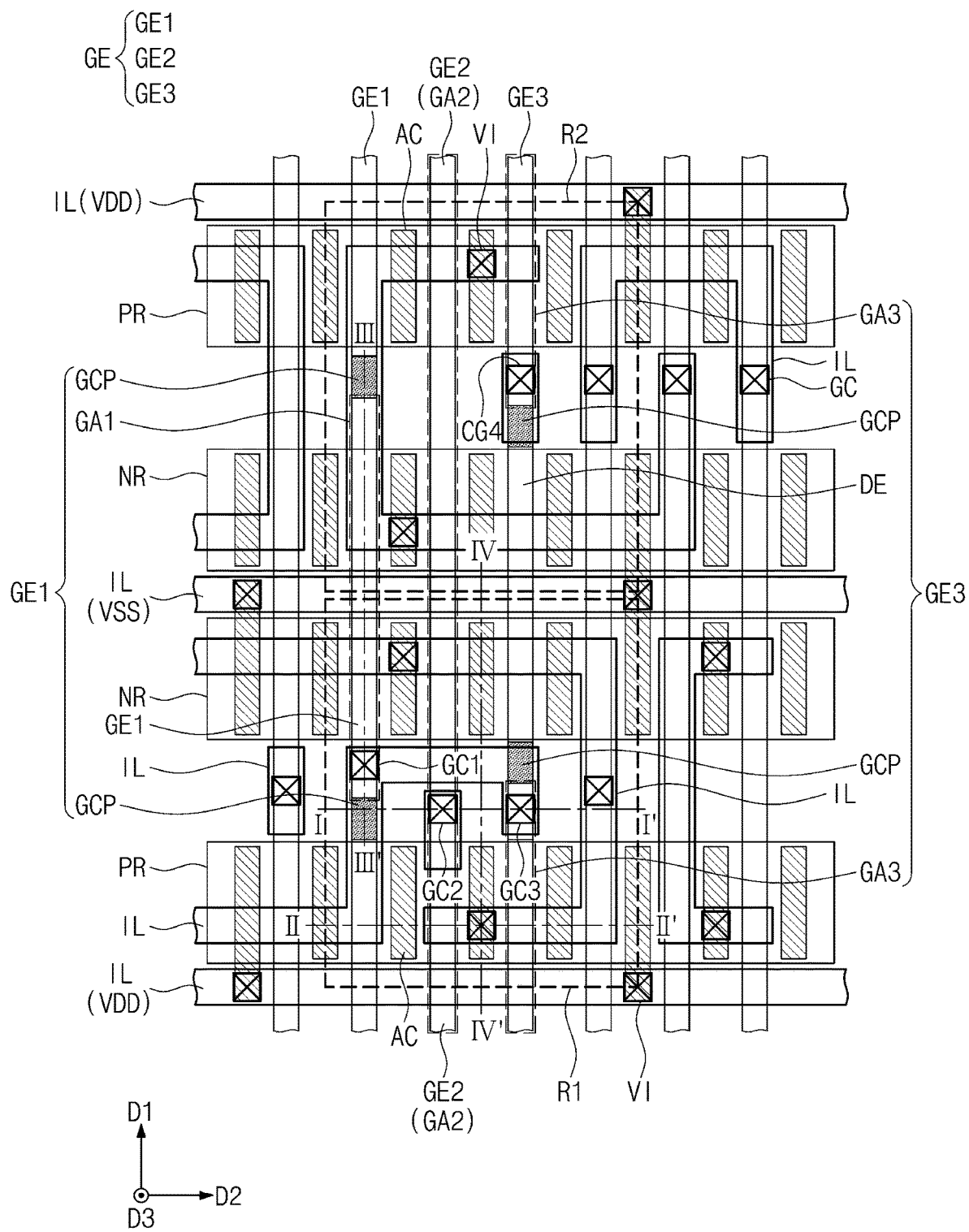
FIG. 7 illustrates a plan view showing a semiconductor device according to some example embodiments of the present inventive concepts.

FIG. 7 illustrates a plan view showing a semiconductor device according to some example embodiments of the present inventive concepts. FIGS. 8A, 8B, 8C, and 8D illustrate cross-sectional views respectively taken along lines I-I', II-II', III-III', and IV-IV' of FIG. 7. The semiconductor device shown in FIGS. 7 and 8A to 8D may be an example in which the flip-flop of FIGS. 2 to 4 and 6 is implemented on a substrate.

Referring to FIGS. 6, 7, and 8A to 8D, a substrate 100 may be provided. For example, the substrate 100 may be a silicon substrate, a germanium substrate, or a silicon-on-insulator (SOI) substrate. The substrate 100 may be provided thereon with a device isolation layer ST defining PMOSFET regions PR and NMOSFET regions NR. The PMOSFET regions PR and the NMOSFET regions NR may be defined by a second trench TR2 on an upper portion of the substrate 100. The device isolation layer ST may fill the second trench TR2. For example, the device isolation layer ST may include a silicon oxide layer.

The PMOSFET and NMOSFET regions PR and NR may be arranged in a first direction D1. Each of the PMOSFET and NMOSFET regions PR and NR may extend in a second direction D2 different from the first direction. For example, a lengthwise direction of each of the PMOSFET and NMOSFET regions PR and NR may be in parallel to the second direction. The PMOSFET and NMOSFET regions PR and NR may be arranged in the first direction D1 in the following sequence: the PMOSFET region PR, the NMOSFET region NR, the NMOSFET region NR, and the PMOSFET region PR. Neighboring PMOSFET and NMOSFET regions PR and NR may be spaced apart from each other in the first direction D1 across the device isolation layer ST.

The PMOSFET region PR may be provided thereon with a plurality of first active patterns FN1 extending in the second direction D2. The NMOSFET region NR may be provided thereon with a plurality of second active patterns FN2 extending in the second direction D2. The first and second active patterns FN1 and FN2 may be vertically protruding portions of the substrate 100. In an example embodiment, the first and second active patterns FN1 and FN2 may be epitaxially grown from the substrate 100 or may be patterned using an etching process. The first and second active patterns FN1 and FN2 may be arranged along the first direction D1.

For example, three first active patterns FN1 may extend side by side along the second direction D2 on the PMOSFET region PR. For example, three second active patterns FN2 may extend side by side along the second direction D2 on the NMOSFET region NR. The numbers and shapes of the first and second active patterns FN1 and FN2 respectively on the PMOSFET and NMOSFET regions PR and NR are exemplary, and not limited to that shown.

A plurality of first trenches TR1 may be defined between a pair of first active patterns FN1 and between a pair of second active pattern FN2. The first trenches TR1 may be arranged adjacent to each other in the first direction D1. The device isolation layer ST may further fill the first trenches TR1.

The first and second active patterns FN1 and FN2 may have their upper portions higher than a top surface of the device isolation layer ST. The upper portions of the first and second active patterns FN1 and FN2 may vertically protrude relative to the device isolation layer ST. The upper portion of each of the first and second active patterns FN1 and FN2 may be shaped like a fin that protrudes from the device isolation layer ST.

The upper portion of each of the first active patterns FN1 may include first channel regions CH1 and first source/drain regions SD1. The first source/drain regions SD1 may be p-type impurity regions. Each of the first channel regions CH1 may be interposed between a pair of first source/drain regions SD1. The upper portion of each of the second active patterns FN2 may include second channel regions CH2 and second source/drain regions SD2. The second source/drain regions SD2 may be n-type impurity regions. Each of the second channel regions CH2 may be interposed between a pair of second source/drain regions SD2.

The first and second source/drain regions SD1 and SD2 may be epitaxial patterns formed by a selective epitaxial growth process. The first and second source/drain regions SD1 and SD2 may have top surfaces higher than those of the first and second channel regions CH1 and CH2.

For example, each of the first source/drain regions SD1 may include a semiconductor element whose lattice constant is greater than that of a semiconductor element of the substrate 100. As a result, the first source/drain region SD1 may provide the first channel region CH1 with compressive stress. For example, the second source/drain region SD2 may include the same semiconductor element as that of the substrate 100. For example, the first source/drain regions SD1 may include silicon-germanium, and the second source/drain regions SD2 may include silicon.

Figure 8A:
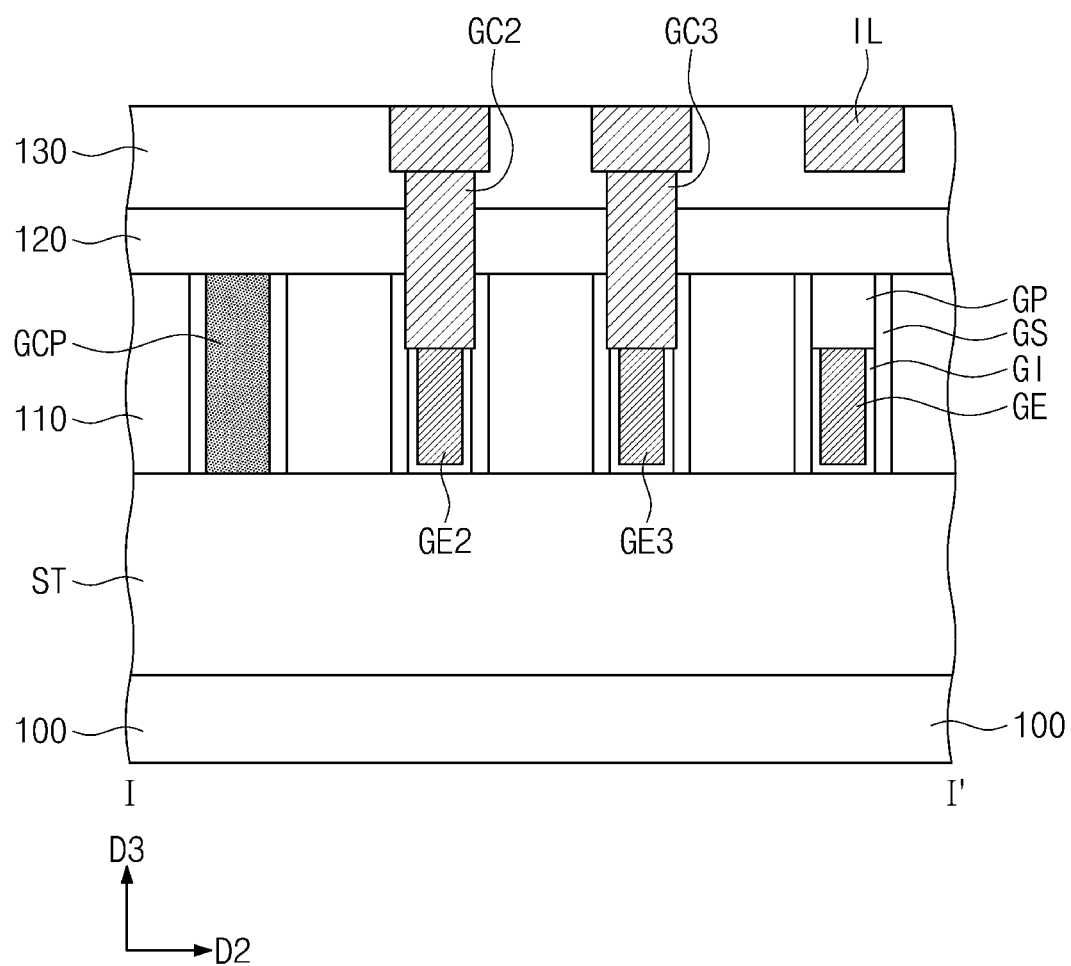
FIGS. 8A, 8B, 8C, and 8D illustrate cross-sectional views respectively taken along lines I-I', II-II', III-III', and IV-IV' of FIG. 7.
Figure 8B:
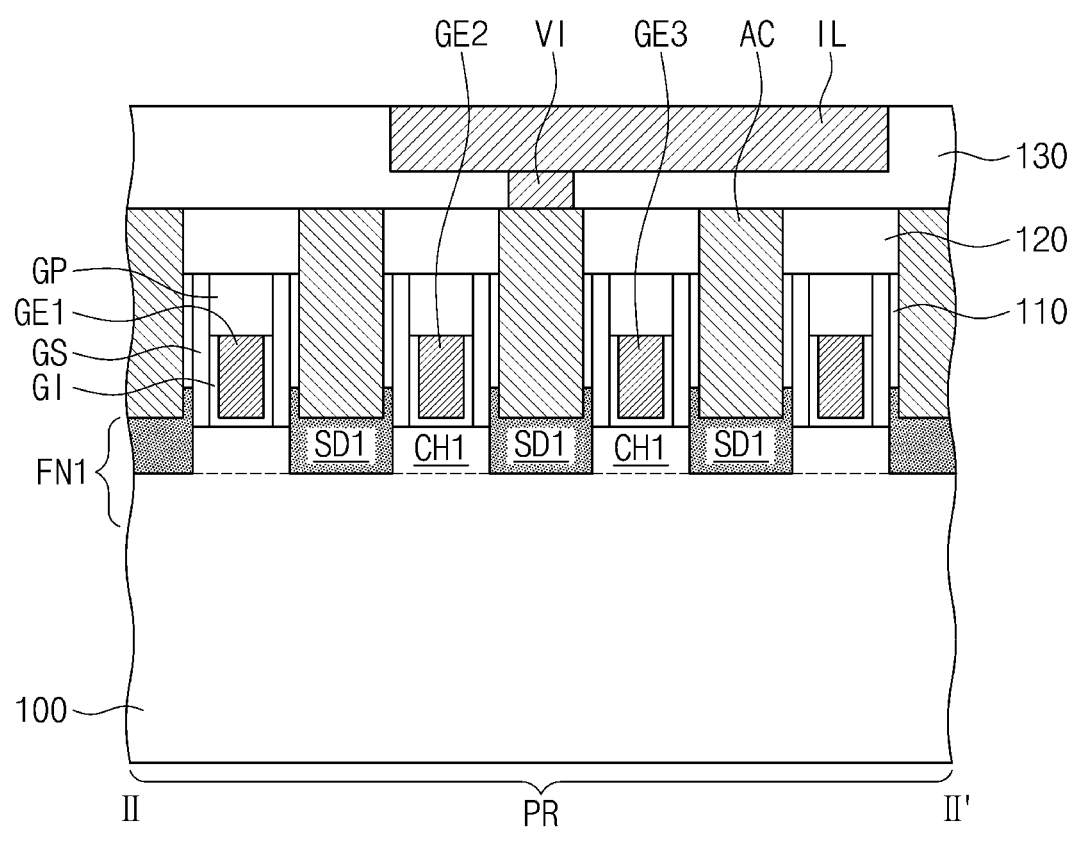
Figure 8C:
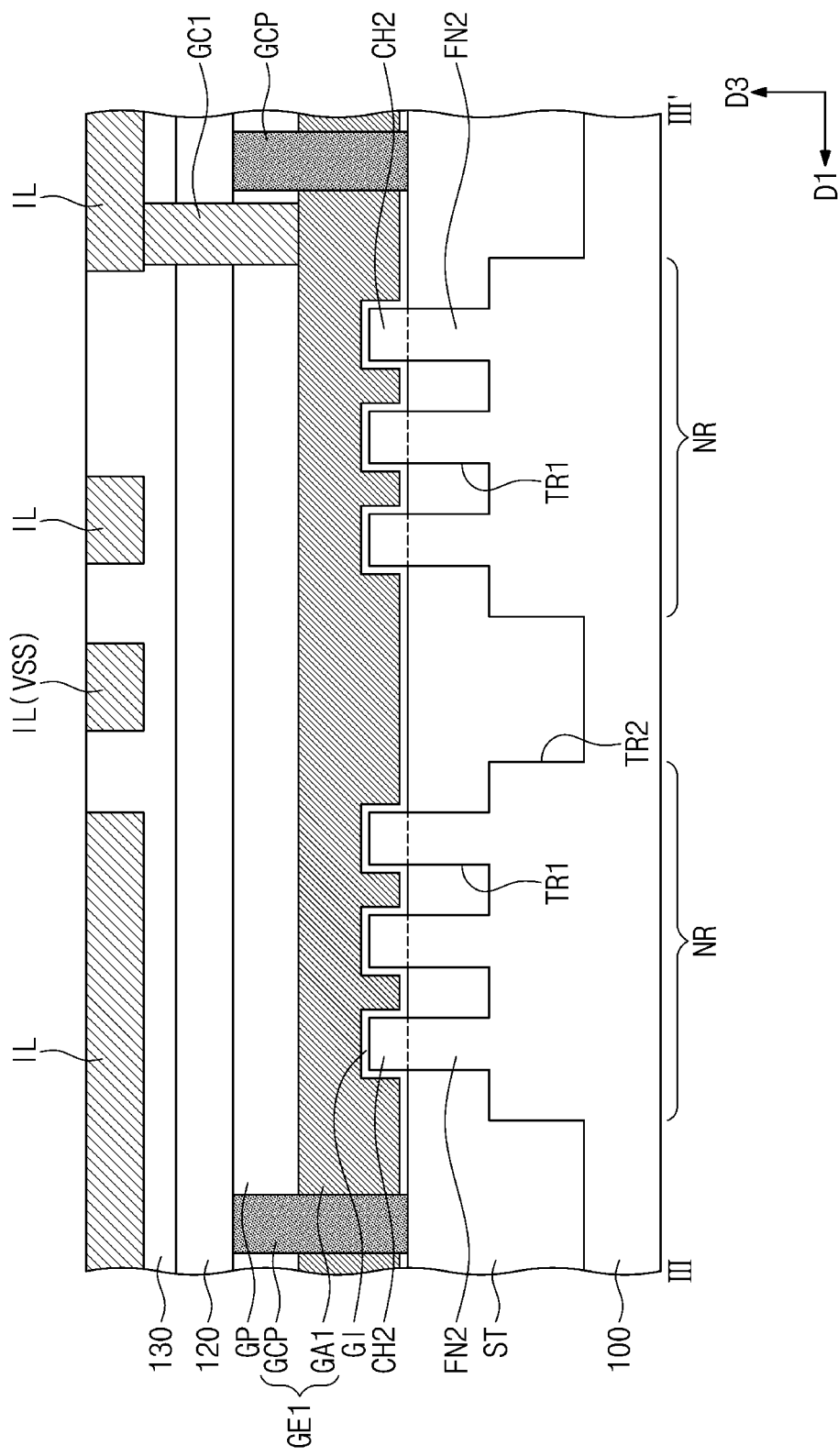
Figure 8D:
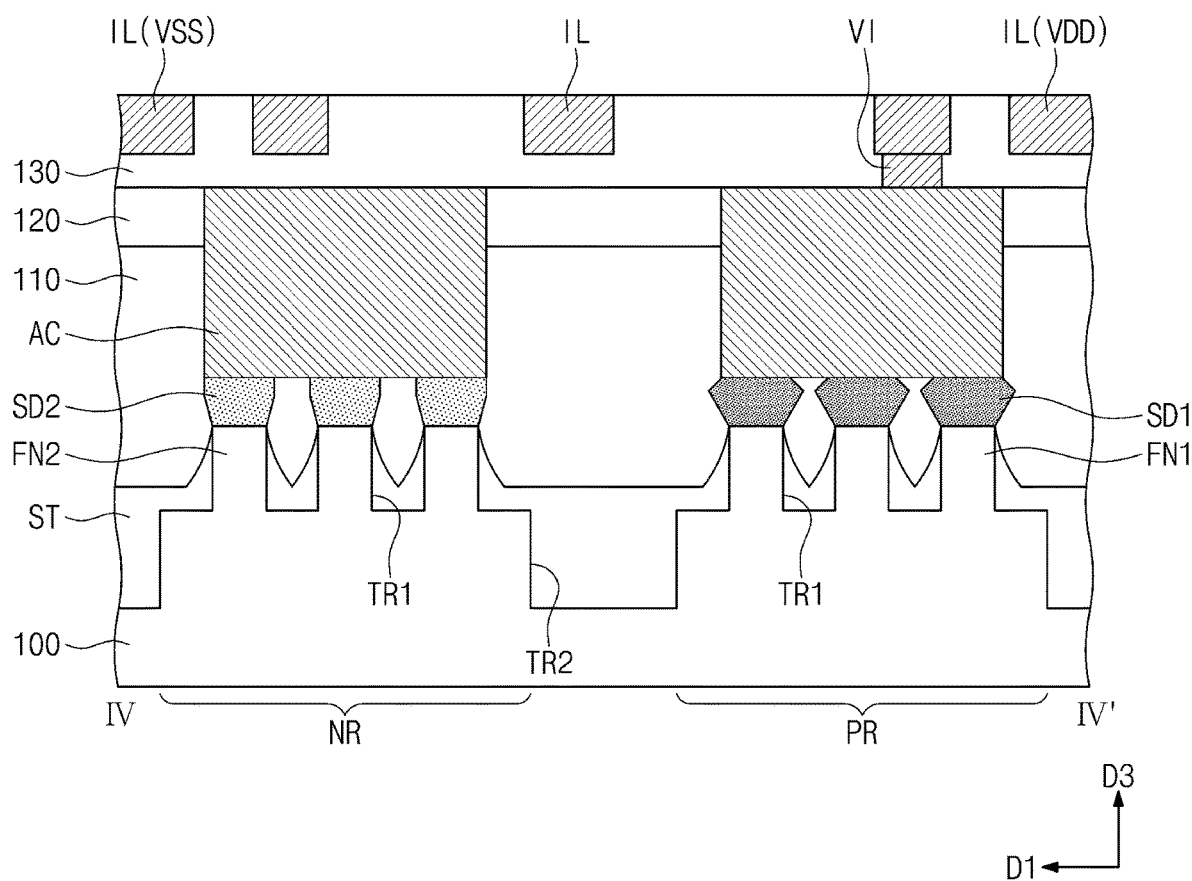

When viewed in cross-section along the first direction D1, each of the first source/drain regions SD1 may have a cross-section different from that of each of the second source/drain regions SD2 (see FIG. 8D).

A plurality of gate electrodes GE may include first, second, and third gate electrodes GE1, GE2, and GE3. The gate electrodes GE may be provided to run across the first and second active patterns FN1 and FN2 and to extend in the first direction D1. Each of the gate electrodes GE may have a straight line shape. The gate electrodes GE may be spaced apart from each other in the second direction D2. The gate electrodes GE may be arranged at a regular interval in the second direction D2.

The gate electrodes GE may vertically overlap the first and second channel regions CH1 and CH2. Each of the gate electrodes GE may be provided on a top surface and opposite sidewalls of each of the first and second channel regions CH1 and CH2 (see FIG. 8C). The gate electrodes GE may include, for example, one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a gate capping layer GP which will be discussed below. For example, the gate spacers GS may include one or more of SiCN, SiCON, and SiN. For another example, the gate spacers GS may include a multiple layer consisting of two or more of SiCN, SiCON, and SiN.

Gate dielectric layers GI may be interposed between the gate electrodes GE and the first and second channel regions CH1 and CH2. Each of the gate dielectric layers GI may extend along a bottom surface of a corresponding one of the gate electrodes GE. Each of the gate dielectric layers GI may cover the top surface and the opposite sidewalls of each of the first and second channel regions CH1 and CH2. The gate dielectric layers GI may include a high-k dielectric material whose dielectric constant is greater than that of a silicon oxide layer. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate capping layer GP may be provided on each of the gate electrodes GE. The gate capping layers GP may extend in the first direction D1 along the gate electrodes GE. The gate capping layers GP may include a material having etch selectivity with respect to first and second interlayer dielectric layers 110 and 120 which will be discussed below. For example, the gate capping layers GP may include one or more of SiON, SiCN, SiCON, and SiN.

A gate cut pattern GCP may be provided to separate the gate electrode GE. The gate cut pattern GCP may serve to cut the gate electrode GE. For example, the gate cut pattern GCP may separate one gate electrode GE into two gate electrodes GE. The gate cut pattern GCP may include a dielectric material, such as silicon oxide or silicon nitride.

The substrate 100 may be provided thereon with the first interlayer dielectric layer 110, the second interlayer dielectric layer 120, and a third interlayer dielectric layer 130 that are sequentially stacked on the substrate 100. Each of the first, second, and third interlayer dielectric layers 110, 120, and 130 may include a silicon oxide layer or a silicon oxynitride layer.

A pair of gate electrodes GE may be provided therebetween with at least one active contact AC that penetrates the first and second interlayer dielectric layers 110 and 120 and has electrical connection with the first and second source/drain regions SD1 and SD2 between the pair of gate electrodes GE. Each of the active contacts AC may have a linear shape extending in the first direction D1. For example, at least one active contact AC may be connected to a plurality of first source/drain regions SD1. For example, at least one active contact AC may be connected to a plurality of second source/drain regions SD2.

At least one gate electrode GE may be provided thereon with at least one gate contact of a plurality of gate contacts GC that penetrates the second interlayer dielectric layer 120 and the gate capping layer GP and has electrical connection with at least one gate electrode GE. When viewed in plan, the gate contact GC may be disposed between the PMOSFET region PR and the NMOSFET region NR. The gate contact GC may vertically overlap the device isolation layer ST that fills the second trench TR2 between the PMOSFET region PR and the NMOSFET region NR.

The active contacts AC and the gate contacts GC may include the same conductive material. The active contacts AC and the gate contacts GC may include at least one metallic material, for example, aluminum, copper, tungsten, molybdenum, and cobalt.

A first metal layer may be provided in the third interlayer dielectric layer 130. The first metal layer may include interconnection lines IL and vias VI. Some of the interconnection lines IL may serve as a power line VDD and some of the interconnection lines IL may serve as a ground line VSS. The interconnection lines IL may extend in the second direction D2. The power line VDD may be adjacent to the PMOSFET region PR. The ground line VSS may be adjacent to the NMOSFET region NR.

The interconnection line IL and the active contact AC may be provided therebetween with the via VI that electrically connects the interconnection line IL and the active contact AC to each other. The interconnection lines IL and the vias VI may include the same conductive material. For example, the interconnection lines IL and the vias VI may include at least one metallic material selected from aluminum, copper, tungsten, molybdenum, and cobalt.

Although not shown, the first metal layer may be provided thereon with additional metal layers (e.g., a second metal layer, a third metal layer, a fourth metal layer, etc.). The additional metal layers may include upper lines disposed on the interconnection lines IL. The first metal layer and the additional metal layers may allow logic cells of a semiconductor device to have connection with each other in accordance with a designed circuit.

A semiconductor device according to some example embodiments of the present inventive concepts may include the first region R1 and the second region R2 that are discussed above with reference to FIG. 6. The first region R1 and the second region R2 may be adjacent to each other in the first direction D1.

In certain embodiments, each of the first and second regions R1 and R2 may include a master latch (e.g., the second part P02) of the first flip-flop cell FF1 and a slave latch (e.g., the third part P03) of the first flip-flop cell FF1.

In other embodiments, the first region R1 may include a master latch of the first flip-flop cell FF1 or a slave latch of the first flip-flop cell FF1, and the second region R2 may include a master latch of the second flip-flop cell FF2 or a slave latch of the second flip-flop cell FF2. The second flip-flop cell FF2 may be adjacent in the first direction D1 to the first flip-flop cell FF1.

In yet other embodiments, the first region R1 may include a scan multiplexer (e.g., the first part P01) of the first flip-flop cell FF1, and the second region R2 may include a scan multiplexer (e.g., the first part P01) of the second flip-flop cell FF2.

The first, second, and third gate electrodes GE1, GE2, and GE3 may be provided on the first region R1 and the second region R2. The first, second, and third gate electrodes GE1, GE2, and GE3 may extend in the first direction D1 from the first region R1 toward the second region R2. The first, second, and third gate electrodes GE1, GE2, and GE3 may be sequentially arranged along the second direction D2. For example, each of the first, second, and third gate electrodes GE1, GE2, and GE3 may extend in a lengthwise direction of each of the first, second, and third gate electrodes GE1, GE2, and GE3. The lengthwise direction may be parallel to the first direction different from the second direction of a lengthwise direction of each of the PMOSFET region PR and the NMOSFET region NR included in each of the first and second regions R1 and R2. The first and second regions R1 and R2 may be arranged in the first direction D1.

The first gate electrode GE1 may include a pair of gate cut patterns GCP and a first gate GA1 between the pair of gate cut patterns GCP. The first gate GA1 may run across the NMOSFET region NR of the first region R1 and the NMOSFET region NR of the second region R2. For example, the first gate GA1 may be connected in common to an NMOS transistor of the first region R1 and an NMOS transistor of the second region R2.

The second gate electrode GE2 may include a second gate GA2 that runs across the PMOSFET and NMOSFET regions PR and NR of the first region R1 and also runs across the PMOSFET and NMOSFET regions PR and NR of the second region R2. For example, the second gate GA2 may be connected in common to a PMOS transistor of the first region R1, an NMOS transistor of the first region R1, an NMOS transistor of the second region R2, and a PMOS transistor of the second region R2.

The third gate electrode GE3 may include a third gate GA3 on the first region R1, a third gate GA3 on the second region R2, a dummy gate DE, and a pair of gate cut patterns GCP. The third gate GA3 on the first region R1 may run across the PMOSFET region PR of the first region R1, and the third gate GA3 on the second region R2 may run across the PMOSFET region PR of the second region R2. For example, the third gate GA3 on the first region R1 may be connected to a PMOS transistor of the first region R1, and the third gate GA3 on the second region R2 may be connected to a PMOS transistor of the second region R2. The dummy gate DE may run across the NMOSFET region NR of the first region R1 and the NMOSFET region NR of the second region R2.

One of the pair of gate cut patterns GCP may be interposed between the dummy gate DE and the third gate GA3 on the first region R1. The other of the pair of gate cut patterns GCP may be interposed between the dummy gate DE and the third gate GA3 on the second region R2. The third gate GA3 on the first region R1, the dummy gate DE, and the third gate GA3 on the second region R2 may be aligned with each other in the first direction D1. The pair of gate cut patterns GCP may separate the dummy gate DE from the third gates GA3.

The gate contacts GC may include first, second and third gate contacts GC1, GC2 and GC3. The first and second gate contacts G1 and GC2 may be provided respectively on the first and second gates GA1 and GA2. The third gate contact GC3 may be provided on the third gate GA3 of the first region R1, and a fourth gate contact GC4 may be provided on the third gate GA3 of the second region R2.

Interconnection lines IL may be provided on the first to fourth gate contacts GC1 to GC4. For example, the first and third gate contacts GC1 and GC3 may be connected in common to a single interconnection line IL. The interconnection lines IL and the first to fourth gate contacts GC1 to GC4 may provide the first and third gates GA1 and GA3 with a first signal A and also provide the second gate GA2 with a second signal A' which is an inverted signal of the first signal A.

When the first region R1 and the second region R2 respectively include a master latch and a slave latch, the first signal A may be a clock signal CLK and the second signal A' may be a clock bar signal /CLK. When the first region R1 and the second region R2 include scan multiplexers of neighboring flip-flop cells, the first signal A may be a scan enable signal SE and the second signal A' may be a scan enable bar signal /SE.

Figure 9:
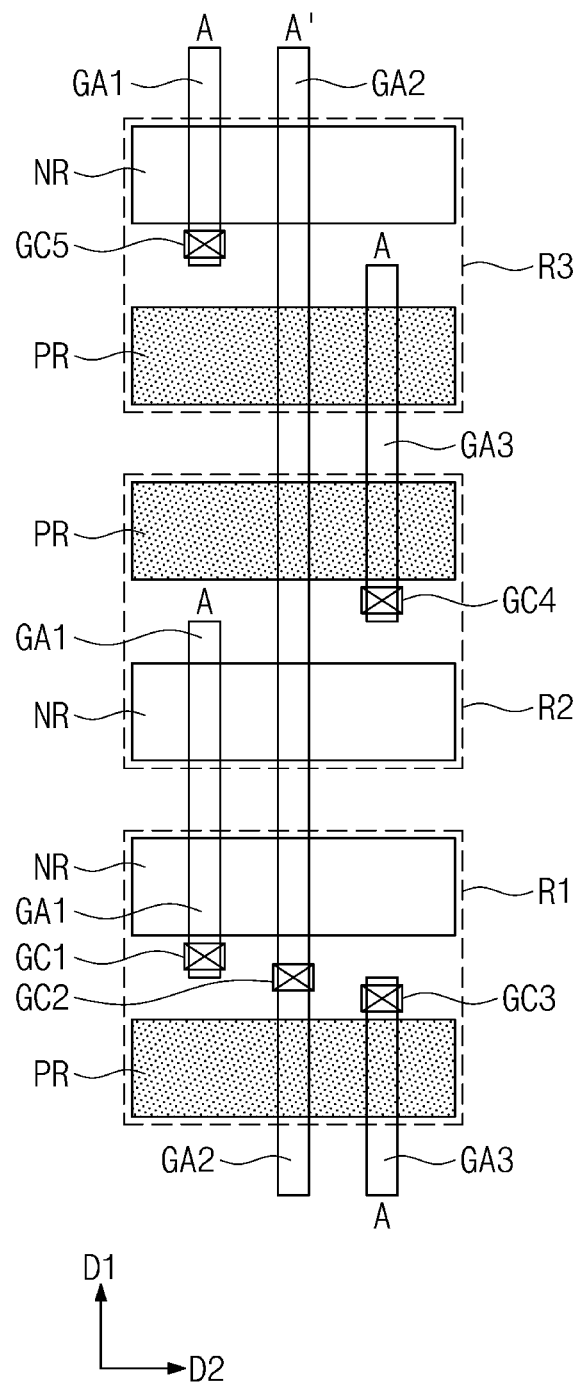
FIG. 9 illustrates a plan view showing first, second, and third regions of a semiconductor device according to some example embodiments of the present inventive concepts.

FIG. 9 illustrates a plan view showing first, second, and third regions of a semiconductor device according to some example embodiments of the present inventive concepts. In the embodiment that follows, a detailed description of technical features repetitive to those discussed above with reference to FIG. 6 will be omitted, and a difference thereof will be discussed in detail.

Referring to FIGS. 1 to 4 and 9, a flip-flop of the present inventive concepts may include the first region R1 and the second region R2, and further include a third region R3 on the substrate. The first, second, and third regions R1, R2, and R3 may be arranged in the first direction D1. The third region R3 may be adjacent in the first direction D1 to the second region R2. The third region R3 may have a substantially identical or similar shape to that of the first region R1.

The second signal A' may be applied in common to the second gates GA2 of the first and second regions R1 and R2 and the second gate GA2 of the third region R3. The second gates GA2 of the first, second, and third regions R1, R2, and R3 may be connected to each other to constitute a single second gate electrode.

The first signal A may be applied in common to the third gate GA3 of the second region R2 and the third gate GA3 of the third region R3, and the first gate GA1 of the first region R1 and the first gate GA1 of the second region R2. The third gate GA3 of the second region R2 and the third gate GA3 of the third region R3 may be connected to each other to constitute a single third gate electrode. The first signal A may also be applied to the third gate GA3 of the first region R1 that is spaced apart from the third gate GA3 of the second region R2 and the third gate GA3 of the third region R3. The first signal A may also be applied to the first gate GA1 of the third region R3 that is spaced apart from the first gate GA1 of the first region R1 and the first gate GA1 of the second region R2.

The first gate contact GC1 may be electrically connected to the first gate GA1 of the first region R1. The second gate contact GC2 may be electrically connected to the second gate GA2 of the first, second, and third regions R1, R2, and R3. The third gate contact GC3 may be electrically connected to the third gate GA3 of the first region R1. The fourth gate contact GC4 may be electrically connected to the third gate GA3 of the second and third regions R2 and R3. A fifth gate contact GC5 may be electrically connected to the first gate GA1 of the third region R3.

The first, third, fourth, and fifth gate contacts GC1, GC3, GC4, and GC5 may be electrically connected to each other through one or more first upper lines. The first and third gates GA1 and GA3 may be supplied in common with the first signal A supplied from the one or more first upper lines. The second gate contact GC2 may be supplied in common with the second signal A' from one or more second upper lines.

In certain embodiments, five gate electrodes and five gate contacts may be required to apply the first signal A and the second signal A' to the first, second, and third regions R1, R2, and R3. In consequence, the numbers of gate electrodes and gate contacts may be reduced, compared to a case in which the first, second, and third regions R1, R2, and R3 are independently spaced apart from each other.

Figure 10:
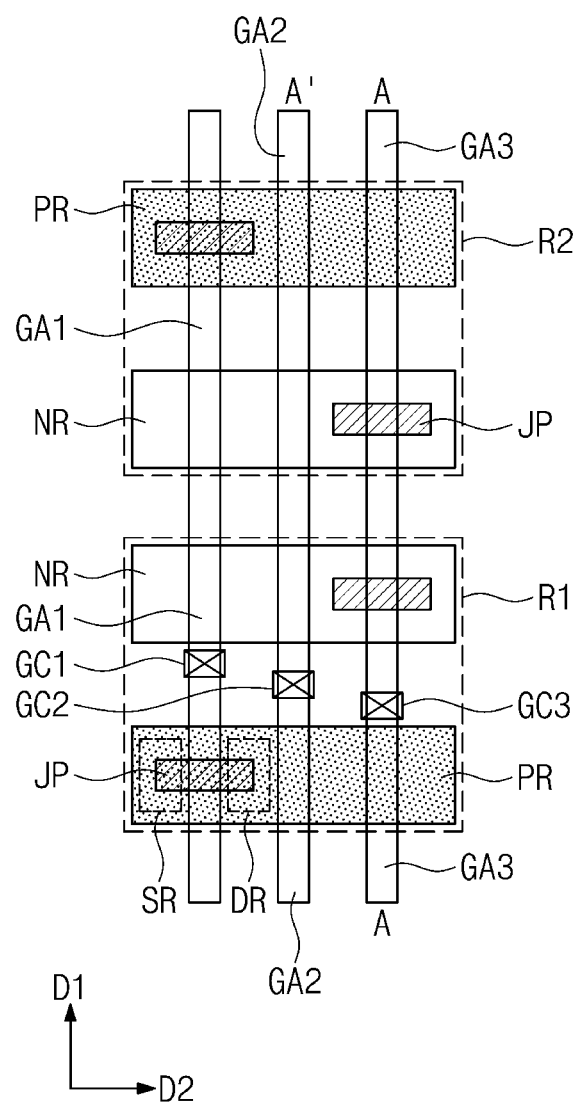
FIG. 10 illustrates a plan view showing first and second regions of a semiconductor device according to some example embodiments of the present inventive concepts.

FIG. 10 illustrates a plan view showing first and second regions of a semiconductor device according to some example embodiments of the present inventive concepts. In the embodiment that follows, a detailed description of technical features repetitive to those discussed above with reference to FIG. 6 will be omitted, and a difference thereof will be discussed in detail.

Referring to FIGS. 1 to 4 and 10, jumpers JP may be provided on the first and second regions R1 and R2. The jumper JP may be provided on the first gate GA1 of the PMOSFET region PR on the first region R1, and may also be provided on the first gate GA1 of the PMOSFET region PR on the second region R2. The jumper JP may be provided on the third gate GA3 of the NMOSFET region NR on the first region R1, and may also be provided on the third gate GA3 of the NMOSFET region NR on the second region R2.

The jumper JP may electrically connect a source region SR and a drain region DR that are on opposite sides of a gate electrode. For example, the jumper JP on the first gate GA1 of the PMOSFET region PR on the first region R1 may electrically connect a source region SR and a drain region DR that are on opposite sides of the first gate GA1.

Because the jumper JP electrically connects the source region SR and the drain region DR of a transistor, there may occur an effect that a transistor is substantially omitted. For example, the transistor with the jumper JP may no longer operate as a transistor. A gate electrode beneath the jumper JP may be similar to a dummy gate that has no function of a gate for a transistor. For example, the jumper JP may serve to cut a gate electrode.

A semiconductor device may include patterned first and third gates GA1 and GA3 (see FIG. 6). Therefore, a patterning process may be required to pattern the first and third gates GA1 and GA3. For example, referring to FIGS. 7 and 8A to 8D, the first gate electrode GE1 may be patterned to form a pair of gate cut patterns GCP to achieve the first gate GA1. In certain embodiments, when the jumper JP is used, there may be no requirement for patterning the first and third gate GA1 and GA3.

In certain embodiments, when the third gate GA3 of the first region R1 is separated from the third gate GA3 of the second region R2, it may be required that the third gate contact GC3 be provided on the third gate GA3 of the first region R1 and the fourth gate contact GC4 also be provided on the third gate GA3 of the second region R2 (see FIG. 6). In other embodiments, the third gate GA3 may continuously extend from the first region R1 toward the second region R2. The third gate GA3 of the first region R1 and the third gate GA3 of the second region R2 may be connected to each other to constitute a single third gate electrode, with the result that the fourth gate contact GC4 may be omitted. For example, three gate electrodes and three gate contacts may be required to apply the first signal A and the second signal A' to the first region R1 and the second region R2 (see FIG. 10).

Figure 11:
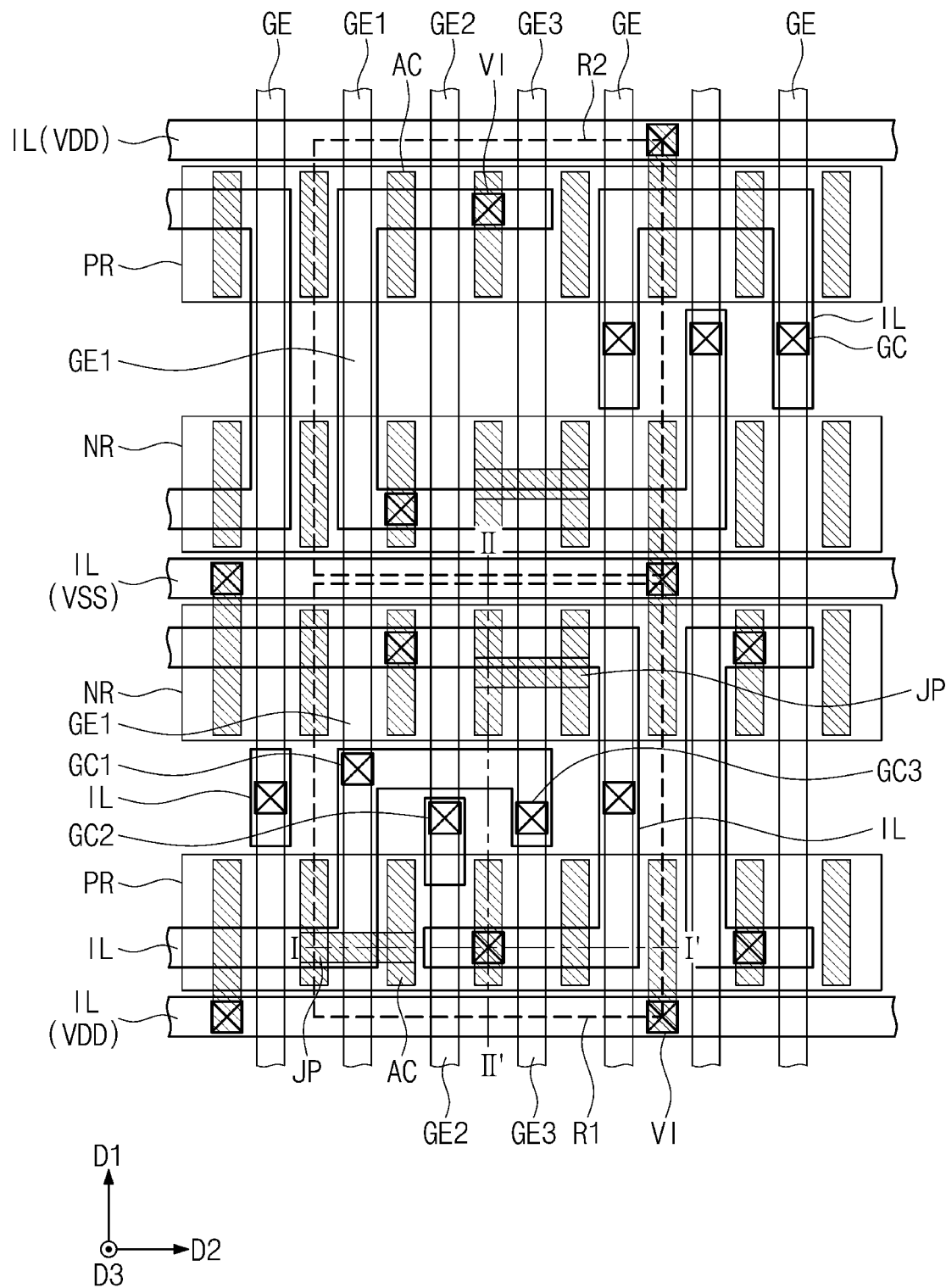
FIG. 11 illustrates a plan view showing a semiconductor device according to some example embodiments of the present inventive concepts.
Figure 12A:
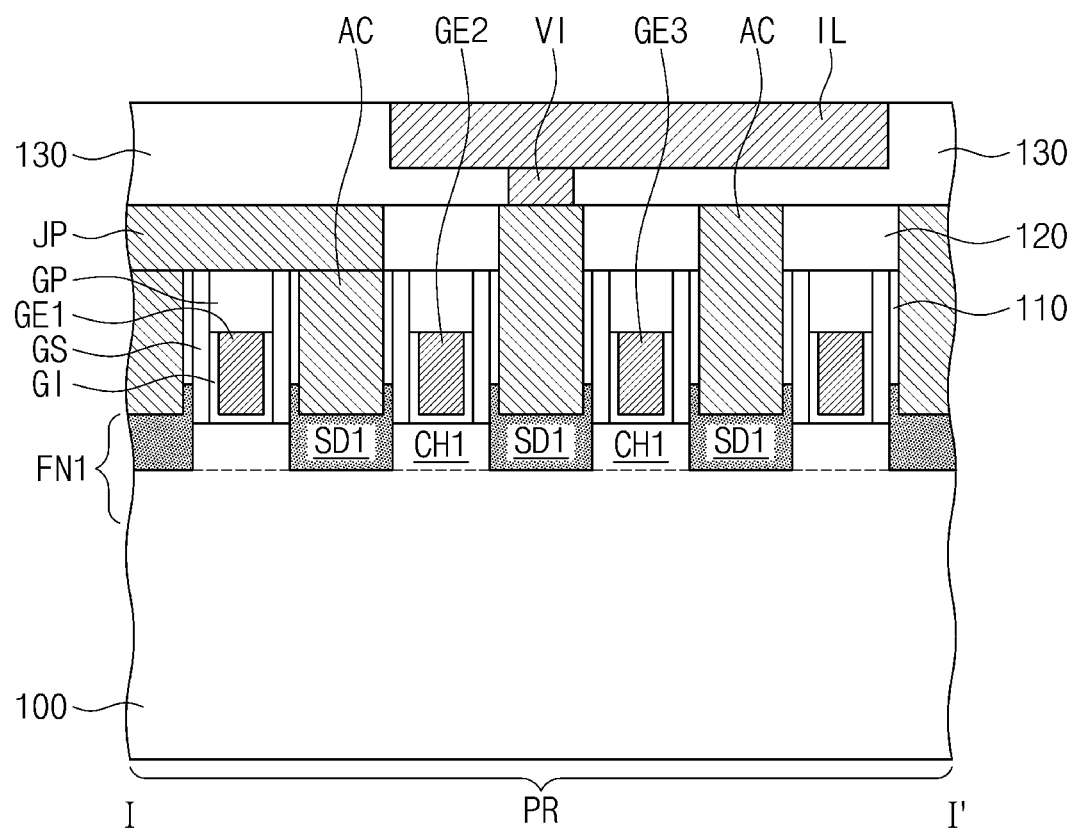
FIGS. 12A and 12B illustrate cross-sectional views respectively taken along lines I-I' and II-II' of FIG. 11.
Figure 12B:
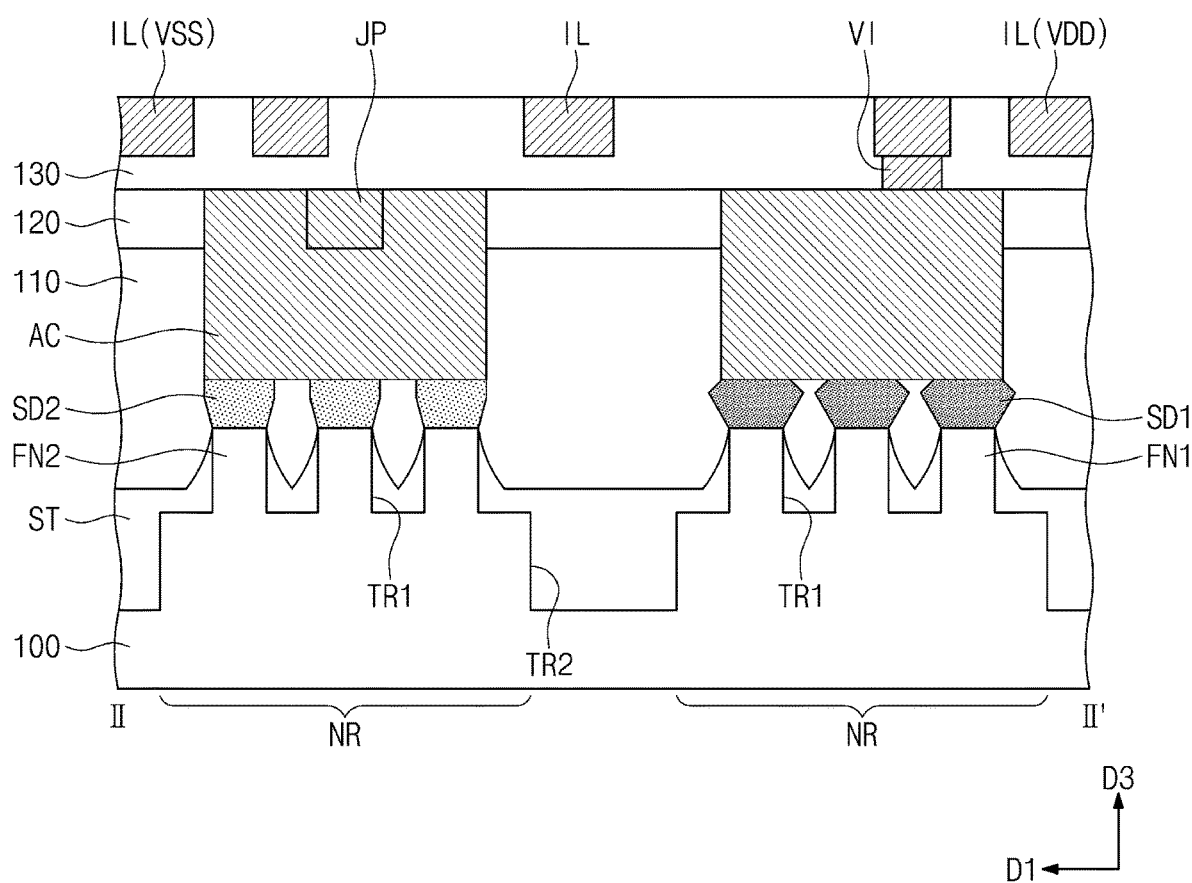

FIG. 11 illustrates a plan view showing a semiconductor device according to some example embodiments of the present inventive concepts. FIGS. 12A and 12B illustrate cross-sectional views respectively taken along lines I-I' and II-II' of FIG. 11. The semiconductor device shown in FIGS. 11, 12A, and 12B may be an example in which the flip-flop of FIGS. 2 to 4 and 10 is implemented on a substrate. In the embodiment that follows, a detailed description of technical features repetitive to those formerly discussed with reference to FIGS. 7 and 8A to 8D will be omitted. and a difference thereof will be discussed in detail.

Referring to FIGS. 10, 11, 12A, and 12B, the gate cut patterns GCP may be omitted, compared to an exemplary embodiment of FIG. 7. The jumper JP may be provided on the first gate GA1 of the PMOSFET region PR on the first region R1, and may also be provided on the first gate GA1 of the PMOSFET region PR on the second region R2. The jumper JP may be provided on the third gate GA3 of the NMOSFET region NR on the first region R1, and may also be provided on the third gate GA3 of the NMOSFET region NR on the second region R2.

The jumper JP may be provided in the second interlayer dielectric layer 120. The gate capping layer GP may separate the jumper JP from the gate electrode GE. The jumper JP may be provided on a pair of active contacts AC on opposite sides of the gate electrode GE. The jumper JP may electrically connect the pair of active contacts AC to each other. The jumper JP may serve to render a transistor thereunder inoperable. For example, the jumper JP may include the same metallic material as that of the active contacts AC.

According to the present inventive concepts, a semiconductor device may be configured such that gate electrodes on a plurality of regions are formed into a single gate electrode to apply a signal in common to the plurality of regions. The number of upper lines for routing may be decreased due to a reduction in the numbers of gate electrode and gate contacts. This result may reduce areas of connection lines for routing, and thus a semiconductor device may increase in integration.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
    a substrate including a first region and a second region that is adjacent in a first direction to the first region, each of the first and second regions including a first type region and a second type region that is adjacent in the first direction to the first type region, each of the first and second type regions extending lengthwise in a second direction different from the first direction;
    a first gate electrode, a second gate electrode, and a third gate electrode that extend from the first region toward the second region, each of the first, second, and third gate electrodes extending lengthwise in the first direction, the second gate electrode being between the first and third gate electrodes;
    a first source region and a first drain region that are on the first type region of the first region and adjacent to each other in the second direction, the first gate electrode on the first type region of the first region being between the first source region and the first drain region;
    a second source region and a second drain region that are on the first type region of the second region and adjacent to each other in the second direction, the first gate electrode on the first type region of the second region being between the second source region and the second drain region;
    a first active contact connected to the first source region and a second active contact connected to the first drain region;
    a third active contact connected to the second source region and a fourth active contact connected to the second drain region;
    a first gate contact on the first region, the first gate contact overlapping the first gate electrode and electrically connected to the first gate electrode;
    a first jumper on the first and second active contacts;
    a second jumper on the third and fourth active contacts;
    a first interconnection line extending lengthwise in the second direction and adjacent to the first type region of the first region;
    a second interconnection line extending lengthwise in the second direction and between the first and second regions; and
    a third interconnection line extending lengthwise in the second direction and adjacent to the first type region of the second region,
    wherein the first jumper crosses the first gate electrode in the second direction and electrically connects the first source region to the first drain region,
    wherein the second jumper crosses the first gate electrode in the second direction and electrically connects the second source region to the second drain region,
    wherein each of the first interconnection line and the third interconnection line is one of a power line and a ground line, and
    wherein the second interconnection line is the other of the power line and the ground line.

2. The semiconductor device of claim 1,
    wherein the first and third gate electrodes are configured to receive a first signal, and
    wherein the second gate electrode is configured to receive a second signal that is an inverted signal of the first signal.

3. The semiconductor device of claim 2,
    wherein one of the first signal and the second signal is a clock signal, and the other of the first signal and the second signal is a clock bar signal.

4. The semiconductor device of claim 1, further comprising:
    a third source region and a third drain region that are on the second type region of the first region and adjacent to each other in the second direction, the third gate electrode on the second type region of the first region being between the third source region and the third drain region;
    a fifth active contact connected to the third source region and a sixth active contact connected to the third drain region; and
    a third jumper on the fifth and sixth active contacts,
    wherein the third jumper crosses the third gate electrode in the second direction and electrically connects the third source region to the third drain region.

5. The semiconductor device of claim 1, further comprising:
    a fourth source region and a fourth drain region that are on the second type region of the second region and adjacent to each other in the second direction, the third gate electrode on the second type region of the second region being between the fourth source region and the fourth drain region;
    a seventh active contact connected to the fourth source region and an eighth active contact connected to the fourth drain region; and
    a fourth jumper on the seventh and eighth active contacts,
    wherein the fourth jumper crosses the third gate electrode in the second direction and electrically connects the fourth source region to the fourth drain region.

6. The semiconductor device of claim 1, further comprising:
    a second gate contact on the first region and electrically connected to the third gate electrode.

7. The semiconductor device of claim 6, further comprising:
    a fourth interconnection line electrically connecting the first gate contact to the second gate contact.

8. The semiconductor device of claim 1, further comprising:
    a plurality of active fins on the first and second type regions of each of the first and second regions.

9. The semiconductor device of claim 8, wherein
    wherein the plurality of active fins of the first region are configured to form a master latch of a flip-flop cell, and
    wherein the plurality of active fins of the second region are configured to form a slave latch of the flip-flop cell.

10. The semiconductor device of claim 1,
    wherein a jumper is not formed on the second gate electrode.

11. A semiconductor device, comprising:
a substrate including a first region and a second region that is adjacent in a first direction to the first region, each of the first and second regions including a P-type metal-oxide field-effect transistor (PMOSFET) region and an N-type metal-oxide field-effect transistor (NMOSFET) region that is adjacent in the first direction to the PMOSFET region;
a plurality of active fins on each of the first and second regions;
a first gate electrode, a second gate electrode, and a third gate electrode that extend from the first region toward the second region, the first, second, and third gate electrodes crossing the plurality of active fins;
a first gate cut pattern between the PMOSFET region and the NMOSFET region of the first region, the first gate cut pattern penetrating and dividing the first gate electrode;
a second gate cut pattern between the PMOSFET region and the NMOSFET region of the second region, the second gate cut pattern penetrating and dividing the first gate electrode;
a third gate cut pattern between the PMOSFET region and the NMOSFET region of the first region, the third gate cut pattern penetrating and dividing the third gate electrode;
a fourth gate cut pattern between the PMOSFET region and the NMOSFET region of the second region, the fourth gate cut pattern penetrating and dividing the third gate electrode;
a first power line extending lengthwise in a second direction different from the first direction and adjacent to the PMOSFET region of the first region;
a ground line extending lengthwise in the second direction and between the first and second regions; and
a second power line extending lengthwise in the second direction and adjacent to the PMOSFET region of the second region,
wherein each of the first, second, and third gate electrodes extends in the first direction such that each of the first, second, and third gate electrodes extends lengthwise in the first direction,
wherein each of the PMOSFET region and the NMOSFET region extends lengthwise in a second direction different from the first direction,
wherein the second gate electrode is interposed between the first gate electrode and the third gate electrode in the second direction, and
wherein the first gate cut pattern includes silicon nitride.

12. The semiconductor device of claim 11,
wherein the first and third gate electrodes are configured to receive a first signal, and
wherein the second gate electrode is configured to receive a second signal that is an inverted signal of the first signal.

13. The semiconductor device of claim 12,
wherein one of the first signal and the second signal is a clock signal, and the other of the first signal and the second signal is a clock bar signal.

14. The semiconductor device of claim 11,
wherein a gate cut pattern is not formed on the second gate electrode.

15. The semiconductor device of claim 11, further comprising:
a gate dielectric layer between the first gate electrode and a corresponding one of the plurality of active fins; and
a pair of gate spacers on opposite sidewalls of the first gate electrode,
wherein a top surface of the first gate cut pattern is higher than a top surface of the first gate electrode.

16. The semiconductor device of claim 15, further comprising:
a gate capping pattern on the top surface of the first gate electrode,
wherein the top surface of the first gate cut pattern is substantially coplanar with a top surface of the gate capping pattern.

17. The semiconductor device of claim 11, further comprising:
a first interlayer dielectric layer on the substrate, a top surface of the first interlayer dielectric layer being substantially coplanar with a top surface of the first gate cut pattern;
a second interlayer dielectric layer on the first interlayer dielectric layer and the first gate cut pattern;
an active contact penetrating the first and second interlayer dielectric layers, a top surface of the active contact being substantially coplanar with a top surface of the second interlayer dielectric layer; and
a third interlayer dielectric layer on the second interlayer dielectric layer and the active contact.

18. The semiconductor device of claim 11, further comprising:
a first interlayer dielectric layer on the substrate, a top surface of the first interlayer dielectric layer being substantially coplanar with a top surface of the first gate cut pattern;
a second interlayer dielectric layer on the first interlayer dielectric layer and the first gate cut pattern;
an active contact penetrating the first and second interlayer dielectric layers, a top surface of the active contact being substantially coplanar with a top surface of the second interlayer dielectric layer;
a third interlayer dielectric layer on the second interlayer dielectric layer and the active contact; and
a via in the third interlayer dielectric layer and disposed on the top surface of the active contact.

19. The semiconductor device of claim 11, further comprising:
a first gate contact overlapping the first gate electrode and electrically connected to the first gate electrode,
wherein the first gate contact is on the first region.

20. The semiconductor device of claim 19, further comprising:
a second gate contact on the second region and electrically connected to the second gate electrode.

21. The semiconductor device of claim 20, further comprising:
a third gate contact on the first region and electrically connected to the third gate electrode; and
a fourth gate contact on the second region and electrically connected to the third gate electrode.

22. The semiconductor device of claim 21, further comprising:
an interconnection line electrically connecting the first gate contact to the third gate contact.

23. The semiconductor device of claim 11,
wherein the plurality of active fins of the first region are configured to form a master latch of a flip-flop cell, and
wherein the plurality of active fins of the second region are configured to form a slave latch of the flip-flop cell.

24. The semiconductor device of claim 11,
wherein the substrate includes a third region including a PMOSFET region and a NMOSFET region,
wherein the second region is between the first region and the third region, and
wherein the second and third gate electrodes further extend toward the third region.

25. The semiconductor device of claim 24, further comprising:
a fifth gate cut pattern between the PMOSFET region and the NMOSFET region of the third region,
wherein the fifth gate cut pattern penetrates and divides the third gate electrode.

26. The semiconductor device of claim 11,
wherein the first and third gate electrodes are configured to receive a first signal, and the second gate electrode is configured to receive a second signal that is an inverted signal of the first signal,
wherein the first gate electrode includes a first gate of the first region and a first gate of the second region,
wherein the first gate electrode extends continuously in the first direction on the first region and the second region so that the first gate of the first region and the first gate of the second region being aligned in the first direction and connected with each other, the first gate electrode being electrically connected to a first gate contact,
wherein the third gate electrode includes a third gate of the first region and a third gate of the second region, the third gate of the first region being electrically connected to a second gate contact and the third gate of the second region being electrically connected to a third gate contact,
wherein the third gate of the first region and the third gate of the second region are spaced apart from each other in the first direction,
wherein the first signal is applied in common to the third gate of the first region and the third gate of the second region through the second gate contact and the third gate contact, respectively, and
wherein the first signal is applied in common to the first gate of the first region and the first gate of the second region through the first gate contact.

27. A semiconductor device, comprising:
a substrate including a first region and a second region that is adjacent in a first direction to the first region, each of the first and second regions including a first type region and a second type region that is adjacent in the first direction to the first type region, each of the first and second type regions extending lengthwise in a second direction different from the first direction;
a first gate electrode, a second gate electrode, and a third gate electrode that extend from the first region toward the second region, each of the first, second, and third gate electrodes extending lengthwise in the first direction, the second gate electrode being between the first and third gate electrodes;
a first gate contact on the first region and electrically connected to the first gate electrode;
a second gate contact on the first region and electrically connected to the second gate electrode;
a third gate contact on the first region and electrically connected to the third gate electrode;
a fourth gate contact on the second region and electrically connected to the third gate electrode;
a first interconnection line extending lengthwise in the second direction and adjacent to the first type region of the first region;
a second interconnection line extending lengthwise in the second direction and between the first and second regions;
a third interconnection line extending lengthwise in the second direction and adjacent to the first type region of the second region; and
a fourth interconnection line electrically connecting the first gate contact to the third gate contact,
wherein each of the first and third interconnection line is one of a power line and a ground line,
wherein the second interconnection line is the other of the power line and the ground line,
wherein the first gate electrode includes:
a first gate on the second type region of the first region; and
a second gate on the second type region of the second region,
wherein the second gate electrode includes:
a third gate on the first type region of the first region;
a fourth gate on the second type region of the second region; and
a fifth gate on the first type region of the second region, the third, fourth and fifth gates being aligned in the first direction and electrically connected with each other,
wherein the third gate electrode includes a sixth gate on the first type region of the second region,
wherein the second gate contact is electrically connected to the third gate of the second gate electrode, and
wherein the fourth gate contact is electrically connected to the sixth gate of the third gate electrode.

28. The semiconductor device of claim 27,
wherein the first and third gate electrodes are configured to receive a first signal, and
wherein the second gate electrode is configured to receive a second signal that is an inverted signal of the first signal.

* * * * *